(12) United States Patent
Heinrich

(10) Patent No.: US 11,965,932 B2
(45) Date of Patent: Apr. 23, 2024

(54) METHOD FOR PREDICTING THE FAILURE OF ELEMENTARY RELAYS

(71) Applicant: Phoenix Contact GmbH & Co. KG, Blomberg (DE)

(72) Inventor: Sebastian Heinrich, Berlin (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 151 days.

(21) Appl. No.: 17/603,240

(22) PCT Filed: May 15, 2020

(86) PCT No.: PCT/EP2020/063589
§ 371 (c)(1),
(2) Date: Oct. 12, 2021

(87) PCT Pub. No.: WO2020/239471
PCT Pub. Date: Dec. 3, 2020

(65) Prior Publication Data
US 2022/0187372 A1    Jun. 16, 2022

(30) Foreign Application Priority Data
May 28, 2019   (DE) ................... 10 2019 114 208.3

(51) Int. Cl.
*G08B 21/00*   (2006.01)
*G01R 31/327*  (2006.01)
*H01H 47/00*   (2006.01)

(52) U.S. Cl.
CPC ....... *G01R 31/3278* (2013.01); *H01H 47/002* (2013.01)

(58) Field of Classification Search
CPC ............. G01R 31/3278; H01H 47/002; H01H 2071/044
See application file for complete search history.

(56) References Cited

U.S. PATENT DOCUMENTS

| 8,699,201 B2* | 4/2014 | Kohri | H01H 1/0015 361/187 |
| 9,048,049 B2* | 6/2015 | Kodama | H01H 47/00 |
| 2013/0335174 A1* | 12/2013 | Kodama | H01H 47/002 335/2 |
| 2014/0002946 A1 | 1/2014 | Kodama | |

FOREIGN PATENT DOCUMENTS

| CN | 103443896 A | 12/2013 |
| CN | 103477410 A | 12/2013 |
| CN | 104272421 A | 1/2015 |
| CN | 104345267 A | 2/2015 |

(Continued)

*Primary Examiner* — Toan N Pham
(74) *Attorney, Agent, or Firm* — Holland & Hart LLP (57) ABSTRACT

The disclosure relates to a method for predicting the failure of an elementary relay having a switch for switching a load contact of a load circuit and an excitation coil for actuating the switch. The method may include exciting the excitation coil in order to switch on the load contact; detecting a time characteristic of a contact voltage at the load contact when switching on the load contact; extracting a characteristic feature from the time characteristic of the contact voltage; and monitoring the characteristic feature during operation of the elementary relay.

20 Claims, 5 Drawing Sheets

(56) References Cited

FOREIGN PATENT DOCUMENTS

| | | |
|---|---|---|
| CN | 107003348 A | 8/2017 |
| CN | 107656200 A | 2/2018 |
| DE | 10 2012 008 601 A1 | 10/2013 |
| JP | H0545396 A | 2/1993 |
| JP | H11316262 A | 1/1999 |
| JP | 2000098000 A | 4/2000 |
| JP | 2003149284 A | 5/2003 |
| JP | 2012199114 | 10/2012 |
| JP | 2012212666 | 11/2012 |
| WO | WO 2006/069959 A1 | 7/2006 |
| WO | WO 2013/137971 A1 | 9/2013 |
| WO | WO 2013/189527 A1 | 12/2013 |

\* cited by examiner

METHOD FOR PREDICTING THE FAILURE OF ELEMENTARY RELAYS

CROSS-REFERENCE

The present application is the national phase entry under 35 U.S.C. 371 of International Patent Application No. PCT/EP2020/063589 by HEINRICH, entitled "METHOD FOR PREDICTING THE FAILURE OF ELEMENTARY RELAYS," filed May 15, 2020, and claims the benefit of German Patent Application No. 10 2019 114 208.3 by HEINRICH, entitled "VERFAHREN ZUR AUSFALL-VORHERSAGE VON ELEMENTARRELAIS," filed May 28, 2019, each of which is assigned to the assignee hereof, and each of which is expressly incorporated by reference in its entirety herein.

TECHNICAL FIELD

The disclosure relates to a method for predicting the failure of elementary relays and a device for monitoring an elementary relay.

BACKGROUND

The reliability of elementary relays is assessed using laboratory tests in accordance with DIN EN 61810-2-1. The key figure is the number of switching cycles at which 10% of the tested relays failed ("B10 value"). These tests are typically carried out for three standard loads, AC and DC. Since it is not known at which load an operator uses the relay, the smallest certain "B10 value" is assumed. On request, customers often receive the specific "B10 values" directly. With the aid of this "B10 value", it is not possible to predict failure of a specific relay or a specific application. The operator of the relay can orientate himself on the number of switching cycles and replace all relays ahead of time. This means that unnecessarily many switching cycles are wasted and early failures continue to occur.

SUMMARY

The object of the disclosure is to better predict the failure of an elementary relay. In particular, it is the object of the disclosure to create a technique with which failures of elementary relays can be detected in good time so that the operator can initiate measures, e.g. an exchange of the relay(s) concerned.

This object is achieved by the objects with the features according to the independent claims. Advantageous examples are the subject matter of the dependent claims, the description, and the drawings.

The disclosure is based on the idea of recording a contact voltage drop when switching on the load contact and of monitoring a characteristic feature in this signal curve. The contact voltage noise or a noise length of the contact voltage noise has proven to be advantageous for such a characteristic feature.

A relay or elementary relay, as described in this application, is an electromagnetically operated, remotely operated switch operated by an electric current and generally having two switch positions. The relay is activated via a control circuit and can switch other circuits.

According to a first aspect, the above-described object is solved by a method for predicting the failure of an elementary relay having a switch for switching a load contact of a load circuit and an excitation coil for actuating the switch, the method comprising exciting the excitation coil in order to switch on the load contact; detecting a time characteristic of a contact voltage at the load contact when switching on the load contact; extracting a characteristic feature from the time characteristic of the contact voltage; and monitoring the characteristic feature.

This has the technical advantage that the failure of the elementary relay can be better predicted. The contact voltage at the load contact is a good indicator of predicting the failure of the elementary relay.

With the characteristic feature, the elementary relay can then be monitored during operation of the elementary relay. The noise length can suddenly increase sharply, that is to say over a period of, for example, greater than 1000 to 10000 switching cycles, so that an imminent failure can be expected. Therefore, the contact voltage should be checked during the entire operation. However, a cyclical measurement of every N switching cycles (SSp) or an averaging over N switching cycles is sufficient for detection. Predicting the failure can be understood here in binary, i.e. noise results in failure; no noise results in no noise-related failure.

The method thus provides the relay operator with a suitable technology with which he can recognize failures of elementary relays in good time in order to initiate measures in good time, e.g. an exchange of the relay(s) concerned.

The switching cycle is the complete change of a switching state in an electrical switch back to the starting position: from the off position to on and back to off, or from on to off and back to on.

A failure means that the switching contacts cannot be reliably connected or disconnected due to contact wear.

In an example of the method, the characteristic feature comprises a contact voltage noise at the load contact during the switch-on process of the elementary relay.

The contact voltage noise at the load contact is a suitable reference quantity for inferring that an failure is imminent. Predicting the failure can be understood here in binary, i.e. noise means failure; no noise means no noise-related failure.

In an example of the method, extracting the contact voltage noise comprises determining a deviation of the detected contact voltage characteristic from a predetermined reference curve.

This has the technical advantage that the characteristic of the contact voltage noise can be determined simply and efficiently. A deviation of the magnitude of the amplitudes of the contact voltage noise in respect to the reference curve, or a quadratic or otherwise weighted deviation, which efficiently evaluates the noise, can be used here as a deviation for example.

In an example of the method, the reference curve represents the time characteristic of the contact voltage at the load contact of a newly manufactured elementary relay.

This has the technical advantage that the reference relates to the original voltage curve of a brand-new relay when the relay is switched on and deviations from this original curve can be efficiently determined.

In an example of the method, the reference curve shows a monotonically falling voltage characteristic from an initial voltage to an end voltage.

This has the technical advantage that the reference curve indicates the ideal switching process from load circuit "off" to load circuit "on", i.e. the switching process of a brand new relay. This reference curve corresponds to a step function that is flattened at the corners, the flattening being due to the switching capacities and inductances of the non-ideal switching elements.

In an example of the method, the method further comprises: monitoring an amplitude of the contact voltage noise during operation of the elementary relay.

This has the technical advantage that the relay can be efficiently monitored in respect to a possible impending failure. With the amplitude of the contact voltage noise, suitable statements can be made about the impending failure of the relay.

In an example of the method, the method further comprises: monitoring a noise length of the contact voltage noise across the load contact during operation of the elementary relay.

This has the technical advantage that the relay can be efficiently monitored with regard to a possible impending failure. With the noise length or duration of the contact voltage noise, suitable statements can be made about the impending failure of the relay.

In an example of the method, the method further comprises: monitoring a change over time in the contact voltage noise across the load contact with respect to a number of switching cycles of the elementary relay.

This has the technical advantage that the relay can be efficiently monitored with regard to a possible impending failure. By monitoring the change in the contact voltage noise over time, suitable statements can be made about a possible failure of the relay.

In an example of the method, the method further comprises: determining a prediction of failure of the elementary relay based on a noise length averaged over the predetermined number of switching cycles.

This has the technical advantage that not every switching cycle has to be checked in order to detect an impending failure. Rather, a cyclical measurement of every N switching cycles or an averaging over N switching cycles is sufficient. This reduces the computing effort and monitoring effort of the method.

In an example of the method, the method further comprises: outputting a warning when a predetermined limit value for the averaged noise length is exceeded.

This has the technical advantage that a reliable indicator for an imminent failure of the relay can be given in a simple manner and the warning notice, e.g. an alarm signal, draws the attention of the operator of the relay to the fact that the relay should be replaced.

According to a second aspect, the above object is solved by a device for monitoring an elementary relay having a switch for switching a load contact of a load circuit and an excitation coil for actuating the switch, the device comprising: a controller which is adapted to excite the excitation coil for switching on the load contact; a detection device for detecting a time characteristic of a contact voltage at the load contact when switching on the load contact by the controller; an evaluation device for extracting a characteristic feature from the time characteristic of the contact voltage; and a monitoring device for monitoring the characteristic feature over a number of switching cycles of the elementary relay.

This has the technical advantage that an elementary relay can be efficiently monitored with such a device and a failure of the elementary relay can be better predicted. As already mentioned above, the contact voltage at the load contact is a good indicator of an imminent failure of the elementary relay.

With the characteristic feature, the monitoring device can monitor the elementary relay during operation of the elementary relay. The noise length can suddenly increase sharply, that is to say over a period of, for example, greater than 1000 to 10000 switching cycles, so that an imminent failure can be expected. Therefore, the contact voltage should be checked during the entire operation. However, a cyclical measurement of every N switching cycles (SSp) or an averaging over N switching cycles is sufficient for detection. Predicting the failure can be understood here in binary, i.e. noise results in failure; no noise results in no noise-related failure.

The monitoring device thus provides the relay operator with a suitable technology with which he can recognize failures of elementary relays in good time in order to initiate measures in good time, e.g. an exchange of the concerned relay(s).

In an example of the device, the characteristic feature comprises a contact voltage noise at the load contact during the switch-on process of the elementary relay.

The contact voltage noise at the load contact is a suitable reference variable for inferring that an imminent failure of the relay is possible. Predicting the failure can be understood here in binary, i.e. noise means failure; no noise means no noise-related failure.

In an example of the device, the detection device is adapted to record the time characteristic of the contact voltage at the load contact for a signal duration of approximately 20 to 50 ms after the excitation of the excitation coil by the controller.

This has the technical advantage that the detection device can record the voltage transition at the load contact from an open relay contact to a closed relay contact in a suitable manner, so that the relevant times at which change processes occur are recorded and can be evaluated. Depending on the relay type, this is a signal duration of around 20 to 50 milliseconds. Of course, it can also be recorded longer.

In an example of the device, the evaluation device is adapted to determine a noise length of the contact voltage noise during operation of the elementary relay; and the monitoring device is adapted to determine a prediction of failure of the elementary relay based on a noise length averaged over the predetermined number of switching cycles.

This has the technical advantage that it can be recognized quickly, if the noise length suddenly increases sharply, which indicates an imminent failure.

BRIEF DESCRIPTION OF THE DRAWINGS

Examples of the disclosure are explained with reference to the accompanying drawings.

DETAILED DESCRIPTION

In this disclosure, reference is provided in respect to the accompanying drawings, which form a part hereof, and in which there is shown, by way of illustration, examples in which the disclosure may be practiced. It goes without saying that other examples can also be used and structural or logical changes can be made without deviating from the concept of the present disclosure. The following disclosure is therefore not to be taken in a limiting sense. Furthermore, it goes without saying that the features of the various examples described herein can be combined with one another, unless specifically stated otherwise.

The aspects and examples are described with reference to the drawings, wherein identical reference characters generally refer to identical elements.

Devices are described and methods are described. It goes without saying that the basic properties of the devices also apply to the method and vice versa. Therefore, for the sake of brevity, this is done without a duplicate description of such properties.

Figure 1:
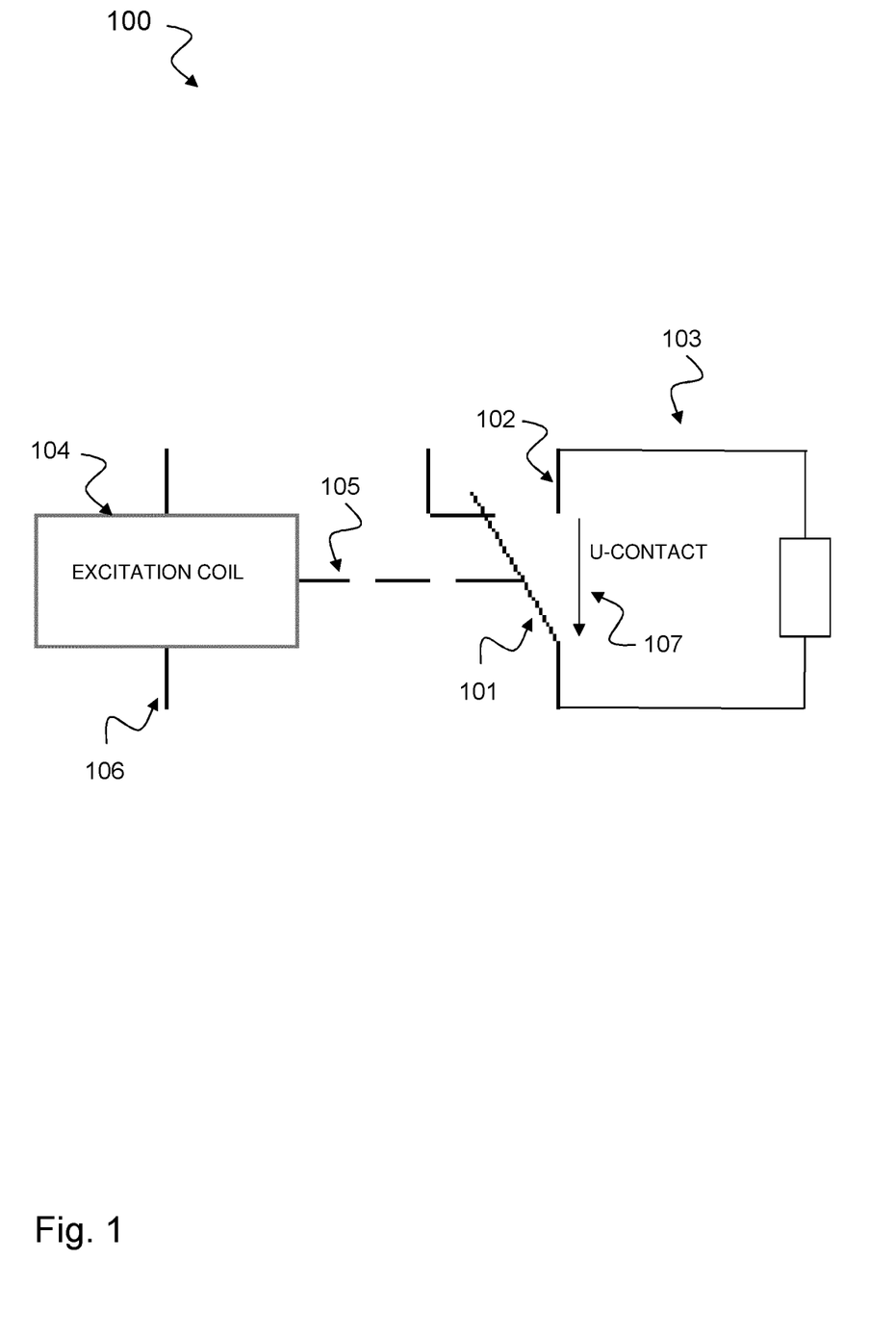
FIG. 1 shows a circuit diagram of an elementary relay with a changeover contact.

FIG. 1 shows a circuit diagram representation of an elementary relay 100 with a changeover contact or load contact 102. The elementary relay 100 comprises a switch 101 for switching a load contact 102 of a load circuit 103 and an excitation coil 104 to switch on 105 the switch 101. The excitation coil 104 can be excited or activated, for example, by applying a voltage to the two contacts 106 of the coil 104. A magnetic field then arises, by means of which a force is exerted on the switch 101, so that the load contact 102 is switched and thus the load circuit 103 is switched on. The force can be applied, for example, via an anchor (not shown). If the voltage is switched off or deactivated from the two contacts 106 of the coil 104, the switch 101 returns to its starting position (as shown in FIG. 1) and the load contact 102 is switched off, and so is the load circuit 103. When switching on the contact voltage 107 at the load contact 102 is reduced, i.e. it changes from an open circuit voltage to a short circuit voltage towards zero. The exact transition of the contact voltage 107 is the subject matter of this application and is described in more detail in the following sections.

The elementary relay 100 can be designed as a mechanical relay, for example. The mechanical relay mostly works on the principle of the electromagnet. A current in the excitation coil generates a magnetic flux through the ferromagnetic core and a movably mounted, likewise ferromagnetic armature attached to it. A force is exerted on the armature at an air gap, causing it to switch one or more contacts. The armature is returned to its original position by spring force as soon as the coil is no longer excited.

Figure 2:
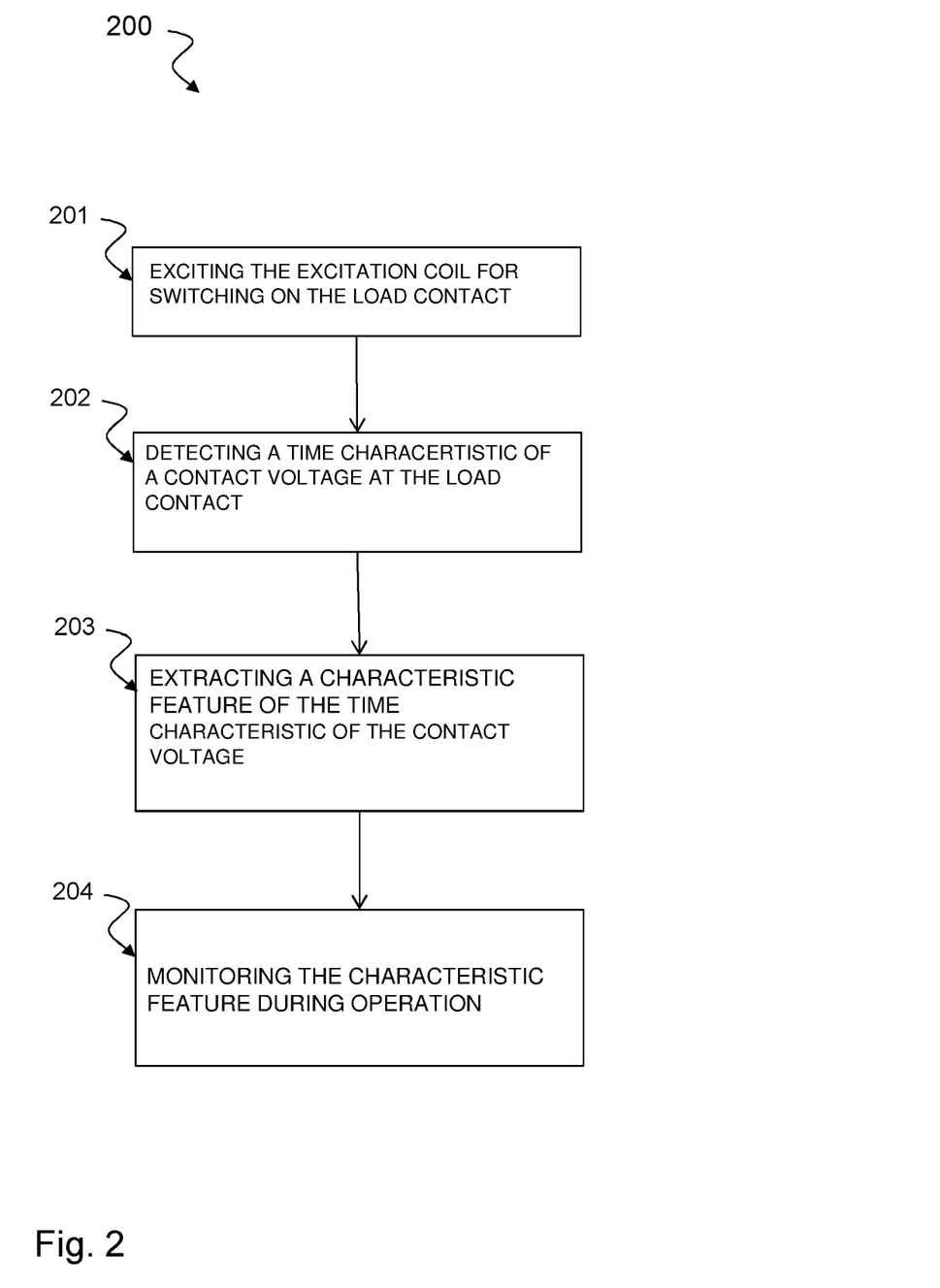
FIG. 2 shows a schematic representation of a method for predicting the failure of a elementary relay according to an example.

FIG. 2 shows a schematic illustration of a method 200 for predicting the failure of a elementary relay 100 according to an example. The elementary relay is, for example, an elementary relay 100 as described in FIG. 1. That is, it comprises a switch 101 for switching a load contact 102 of a load circuit 103 and an excitation coil 104 to switch on 105 the switch 101.

The method 200 comprises exciting 201 the excitation coil 104 in order to switch on 105 the load contact 102; detecting 202 a time characteristic of a contact voltage 107 at the load contact 102 when switching on 105 the load contact 102; extracting 203 a characteristic feature from the time characteristic of the contact voltage 107; and monitoring 204 the characteristic feature over a number of switching cycles of the elementary relay 100.

Figure 3:
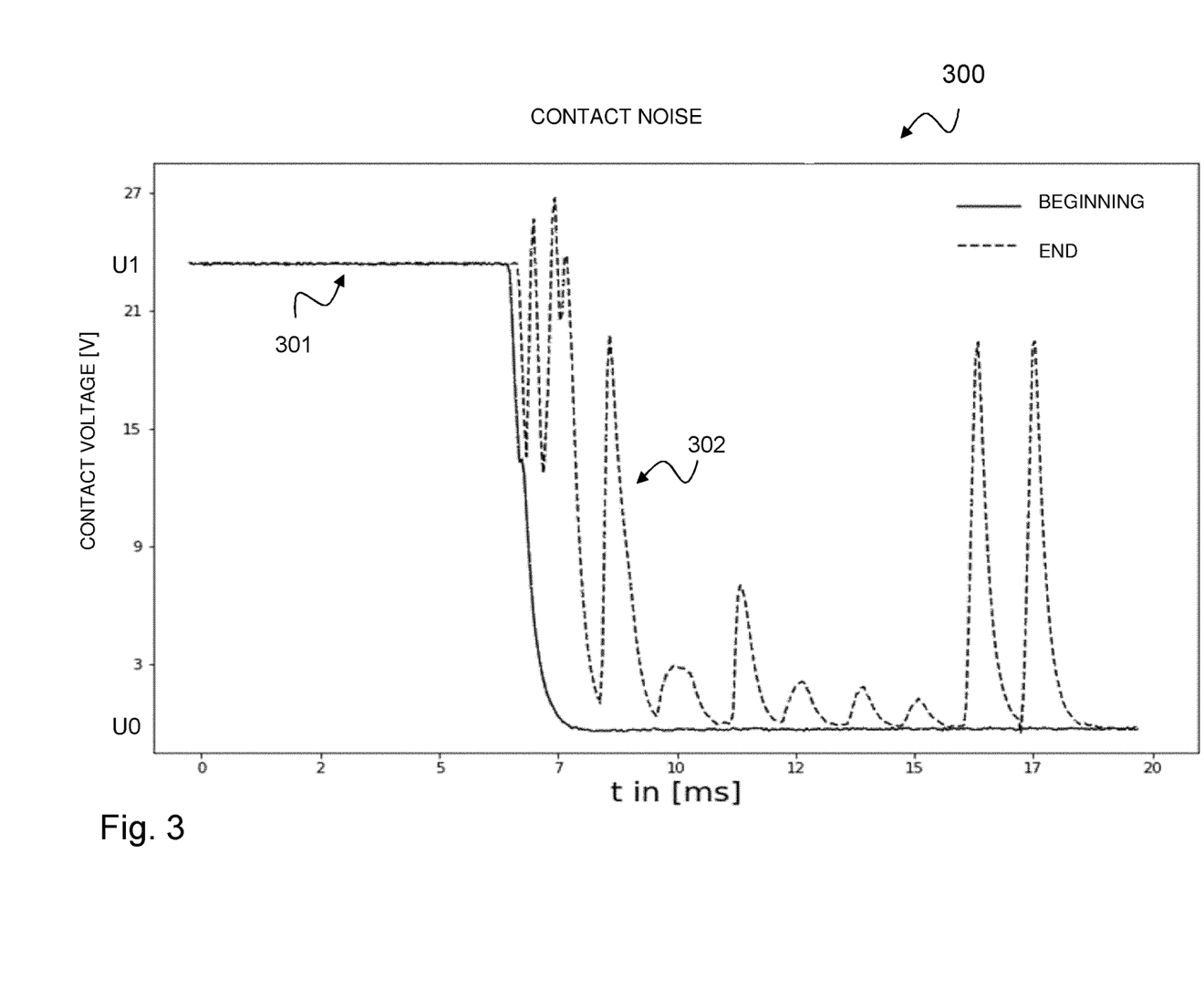
FIG. 3 shows an exemplary time characteristic of the contact noise at the load contact of the elementary relay at the beginning and end of the service life of the elementary relay.

The characteristic feature can comprise, for example, a contact voltage noise at the load contact 102 during the switching-on process 105 of the elementary relay 100, for example a contact voltage noise 300, as shown in FIG. 3.

In one example, extracting the contact voltage noise can comprise determining a deviation of the recorded contact voltage characteristic 302 from a predetermined reference curve 301, e.g. as shown in FIG. 3. The reference curve 301 can indicate a time course of the contact voltage 107 at the load circuit 103 of the newly manufactured elementary relay 100. For example, the reference curve 301 can indicate a monotonically falling voltage characteristic from an initial voltage U1 or open circuit voltage of the load circuit 103 to an end voltage U0 or short circuit voltage of the load circuit 103.

In one example, the method 200 may comprise monitoring an amplitude of the contact voltage noise over a number of switching cycles of the elementary relay 100.

Figure 4:
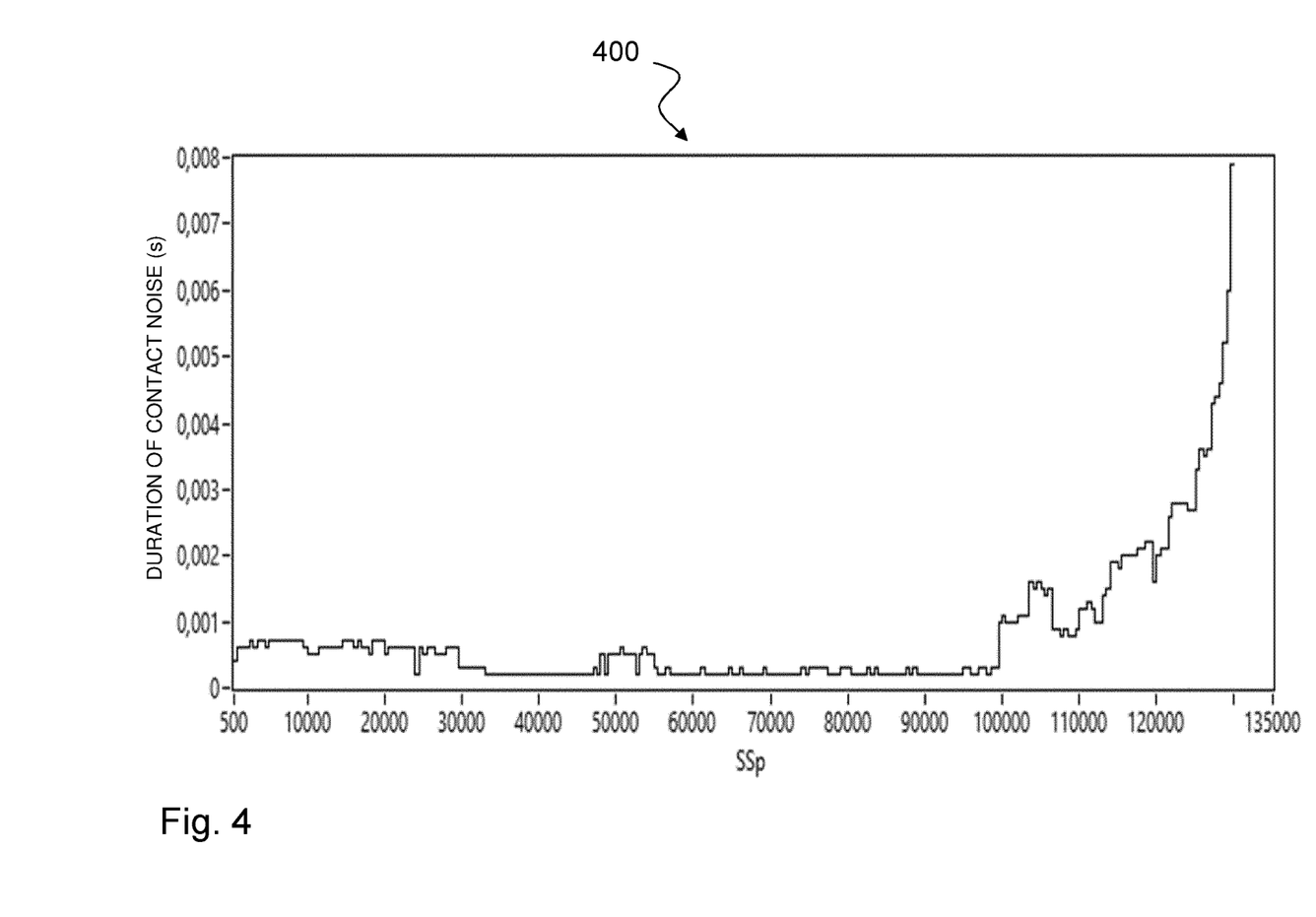
FIG. 4 shows an exemplary characteristic of the contact noise length over a service life of the elementary relay.

In one example, the method 200 may comprise monitoring a noise length or noise duration of the contact voltage noise across the load contact 102 during operation of the elementary relay 100, e.g., a noise length 400 as shown in FIG. 4.

In one example, the method 200 may comprise monitoring a change over time in the contact voltage noise across the load contact 102 during operation of the elementary relay 100. If the contact voltage noise changes, i.e. becomes stronger, an imminent failure can be expected. Monitoring such a change is a suitable measure to be able to make a prediction about an exact failure probability.

In one example, the method 200 may comprise determining a noise length (e.g. see corresponding FIG. 4) of the contact voltage noise during operation; and determining a failure prediction of the elementary relay 100 based on a noise length averaged over the predetermined number of switching cycles. If the noise length is averaged over the switching cycles, i.e. if the noise lengths recorded per switching cycle are averaged, a change in the noise can be recorded and a failure prediction can be made.

In one example, the predetermined number of switching cycles can comprise a predetermined number of successive switch-on processes 105. Alternatively, every n-th switching cycle can be used, e.g. n=2, 3, 4, 5, 10, 20, 30, 40, 50, 100, 200, 300, 400, 500, 1000, 2000, 5000, 10000, etc.

In one example, the method 200 can comprise outputting a warning when a predetermined limit value for the averaged noise length is exceeded. For example, an alarm signal can be displayed, e.g. a red LED for imminent failure or a green LED for non-critical status.

A further example of a method 200 for predicting the failure of an elementary relay 100 is described below. In this example, predicting the failure is based on the "contact voltage noise", i.e. a noise of the voltage at the load contact 102 during the switch-on process.

In order to recognize this feature, the contact voltage drop across the load contact 102 of the elementary relay 100 during the closing process is recorded, e.g. corresponding to a signal duration of 20 to 50 milliseconds after the coil 104 has been switched on, depending on the relay type.

With a new (relay) contact, the transition from high contact voltage (contact open) to low contact voltage close to 0V (contact closed) is quick, i.e. without noise. This transition changes when the contact is used up: the voltage makes several jumps, i.e. the signal is noisy before it remains at the voltage close to 0V, as shown in more detail in FIG. 3.

The noise length, i.e. the duration from the time of the first contact voltage change after the coil 104 is switched on, until it finally remains close to 0V, is a characteristic which indicates an impending failure. FIG. 4 shows a typical characteristic of the noise length during the service life of a relay until failure. This is predictable due to the sharp rise in the curve.

For predicting the failure based on this characteristic, the noise length must be determined for every n-th switching cycle (e.g. n=100). The method of determination is irrelevant for the application. It has proven to be practical to average the voltage signals of several successive switch-on processes and then to determine the noise length.

If the (averaged) noise length exceeds a limit value previously determined in laboratory tests, this is the signal for an imminent failure.

Apart from the limit value, no values need to be saved.

FIG. 3 shows an exemplary time course of the contact noise 300 at the load contact of the elementary relay 100 at the beginning 301 and end 302 of the life of the elementary relay 100. The curve 301 represents the voltage transition of the contact voltage at the load contact for a new relay, i.e. a recording at the beginning of the lifetime of the relay 100. The curve 302 represents the voltage transition of the contact voltage at the load contact for an older or aged relay, i.e. a recording at the beginning of the lifetime of the relay 100. As already mentioned, the lifetime denotes the number of switching cycles or switching operations, which have already been carried out with the relay.

The curve 301 is approximately a step function with beveled edges and represents the transition from the open circuit voltage U1 to the short circuit voltage U0 at the load contact of the load circuit. Here the load contact is still flat and does not show any cracks or fractures due to a wearing off causes by several switching cycles, so that the voltage here changes very quickly from the open-circuit voltage U1 to the short-circuit voltage U0. The curve 301 is monotonically falling. The transition from U1 to U0 takes about one to two milliseconds here.

In the case of curve 302, the course of the steps is hardly recognizable any longer because of the strong noise that is superimposed on the voltage transition. The transition from U1 to U0 is discontinuous and takes place with numerous resets or noise, which indicate the aging processes of the relay. Even after about 10 milliseconds after switching on the relay, there are still two resets that almost reach the output voltage U1.

FIG. 4 shows an exemplary curve of the contact noise length 400 over a service life of the elementary relay 100. The service life is specified in the number of switching cycles (SSp). It was measured in each case how long it takes for the contact voltage at the load contact 102 to pass from U1 to U0 and the respective value plotted against the number of switching cycles. For example, it is possible to measure how long it takes for the contact voltage to approach a predetermined limit value around the end value U0 of the contact voltage.

From a certain number of switching cycles, which can be different for each type of relay, the noise length can suddenly increase, so that a failure of the relay can be expected soon. In the case of the elementary relay from FIG. 4, this happens at a value of around 100,000 switching cycles. Up to this value the noise length is below 0.001; thereafter the noise length increases and rises rapidly from a number of about 130,000 switching cycles, so that an imminent failure of the relay is to be expected. A warning can be given, for example, if the duration of the contact noise exceeds a first limit of e.g. 0.001. A second warning or an alarm can be displayed, for example, if the duration of the contact noise exceeds a second limit of e.g. 0.006. Of course, further limits can be set that indicate further states.

Figure 5:
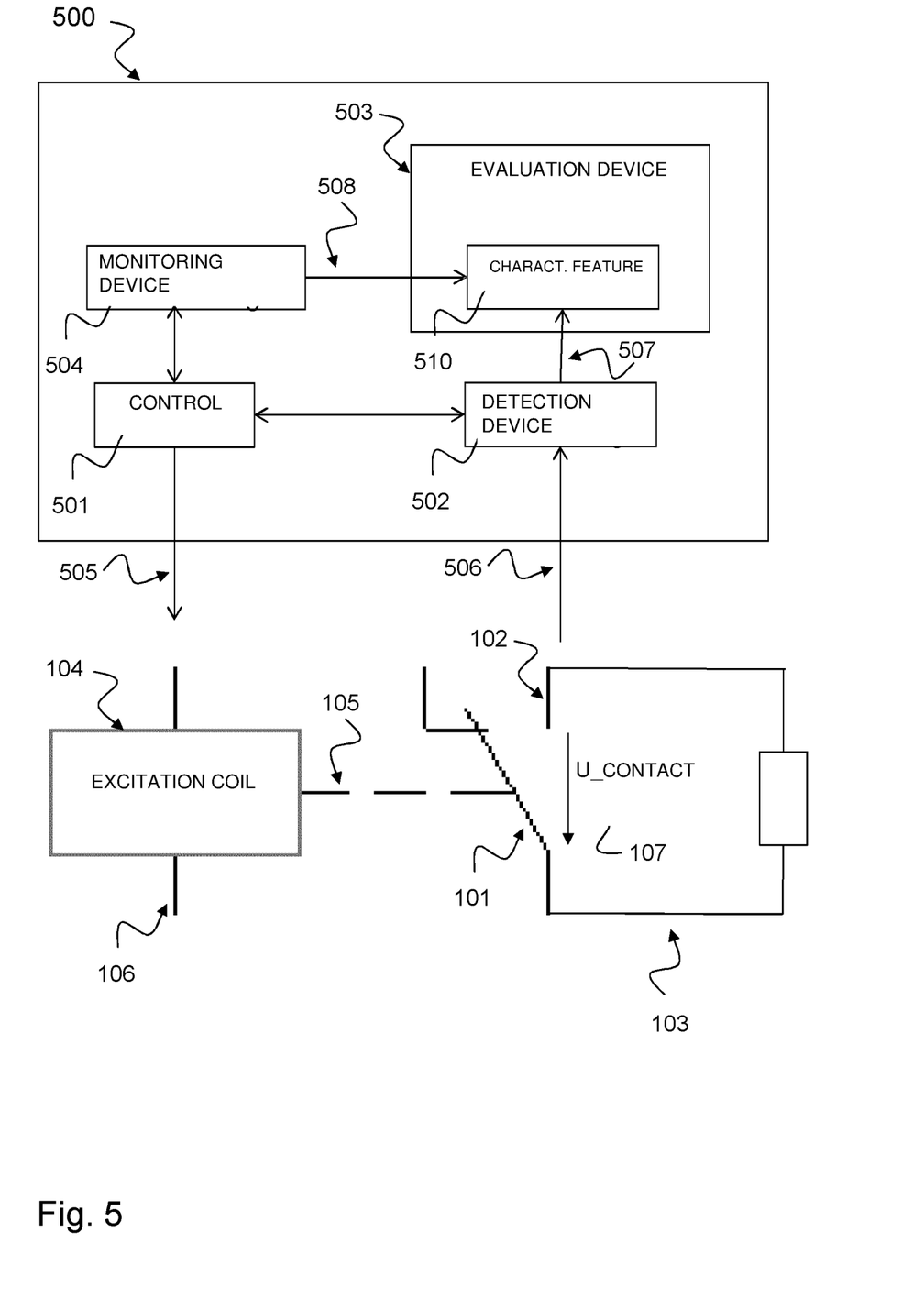
FIG. 5 shows a schematic illustration of a device for monitoring an elementary relay according to an example.

FIG. 5 shows a schematic illustration of a device 500 for monitoring an elementary relay 100 according to an example. The elementary relay is, for example, an elementary relay 100 as described in FIG. 1. That is, it comprises a switch 101 for switching a load contact 102 of a load circuit 103 and an excitation coil 104 for actuating 105 the switch 101.

The device 500 comprises a controller 501 which is adapted to excite 505 the excitation coil 104 in order to switch on 105 the load contact 102. Alternatively, the controller 501 can detect excitation of the coil 104, for example when the excitation is performed by an external device.

The device 500 comprises a detection device 502 for detecting 506 a time characteristic of a contact voltage 107 at the load contact 102 when the control 501 switches on 105 the load contact 102.

The device 500 comprises an evaluation device 503 for extracting 507 a characteristic feature 510 from the time characteristic of the contact voltage 107, e.g. as described above for the method 200 according to FIG. 2.

The device 500 further comprises a monitoring device 504 for monitoring 508 the characteristic feature 510 during operation of the elementary relay 100.

The characteristic feature 510 can comprise a contact voltage noise at the load contact 102 during the switching-on process 105 of the elementary relay 100, for example a contact voltage noise 300 as shown in FIG. 3.

In one example of the device 500, the detection device 502 can be designed to record 506 the time characteristic of the contact voltage 107 at the load contact 102 for a signal duration of approximately 20 to 50 ms after the excitation 510 of the excitation coil 104 by the controller 501.

In one example of the device 500, the evaluation device 503 can be designed to determine a noise length of the contact voltage noise (e.g. in accordance with the illustration in FIG. 4) during operation. The monitoring device 504 can be designed to determine a failure prediction of the elementary relay 100 based on a noise length averaged over the predetermined number of switching cycles.

The detection device 502 can be implemented, for example, as a memory in which the respective contact voltage characteristics are recorded. The evaluation device 503 and the monitoring device 504 can be implemented as a processor or controller, e.g. together with the controller 501 on a processor or chip. Alternatively, the control can be implemented separately from the evaluation device 503 and monitoring device 504. For example, the controller 501 can be an electronic controller in which the relay is installed and the detection device 502, evaluation device 503 and monitoring device 504 are coupled to the controller 501 in order to monitor the relay or to predict failure of the relay.

The controller 501 can be connected to the detection device 502, the evaluation device 503 and the monitoring device 504 by means of communication, in order to control these devices. The monitoring device 500 can be used during laboratory tests in order to make a statement about the probability of failure of certain relay types. Alternatively, the monitoring device 500 can also be used in the field and record the characteristic of the contact voltage at the load contact while the relay is in operation, in order to monitor the relay in the field. In the event of an imminent failure, a warning can be sent to the service staff so that an exchange can be initiated.

What is claimed is:

1. A method for predicting a failure of an elementary relay having a switch for switching a load contact of a load circuit and an excitation coil for actuating the switch, the method comprising:

exciting the excitation coil in order to switch on the load contact;

detecting a time characteristic of a contact voltage at the load contact when switching on the load contact;

extracting a characteristic feature from the time characteristic of the contact voltage; and monitoring the characteristic feature during operation of the elementary relay.

2. The method of claim 1, wherein the characteristic feature comprises a contact voltage noise at the load contact during the switching-on process of the elementary relay.

3. The method of claim 2, wherein extracting the contact voltage noise comprises:

determining a deviation of the detected contact voltage characteristic from a predetermined reference curve.

4. The method of claim 3, wherein the predetermined reference curve represents the time characteristic of the contact voltage at the load contact of a newly manufactured elementary relay.

5. The method of claim 3, wherein the predetermined reference curve shows a monotonically falling voltage characteristic from an initial voltage (U1) to an end voltage (U0).

6. The method of claim 2, further comprising:

monitoring an amplitude of the contact voltage noise during operation of the elementary relay.

7. The method of claim 2, further comprising:

monitoring a noise length of the contact voltage noise across the load contact during operation of the elementary relay.

8. The method of claim 2, further comprising:

monitoring a change over time in the contact voltage noise across the load contact with respect to a number of switching cycles of the elementary relay.

9. The method of claim 2, further comprising:

determining a prediction of failure of the elementary relay based on a noise length averaged over a predetermined number of switching cycles.

10. The method of claim 9, further comprising:

outputting a warning when a predetermines limit value for the averaged noise length is exceeded.

11. A device for monitoring an elementary relay having a switch for switching a load contact of a load circuit and an excitation coil for actuating the switch, the device comprising:

a controller, which is configured to excite the excitation coil for switching on the load contact;

a detection device configured to detect a time characteristic of a contact voltage at the load contact when switching on the load contact by the controller;

an evaluation device configured to extract a characteristic feature from the time characteristic of the contact voltage; and a monitoring device configured to monitor the characteristic feature during operation of the elementary relay.

12. The device of claim 11, wherein the characteristic feature comprises a contact voltage noise at the load contact during the switching-on process of the elementary relay.

13. The device of claim 12, wherein the detection device is further configured to:

record the time characteristic of the contact voltage at the load contact for a signal duration of approximately 20 to 50 ms after the excitation of the excitation coil by the controller.

14. The device of claim 12, wherein the evaluation device is further configured to:

determine a noise length of the contact voltage noise during operation of the elementary relay.

15. The device of claim 12, wherein the monitoring device is further configured to:

determine a prediction of failure of the elementary relay based on a noise length of the contact voltage noise averaged over a predetermined number of switching cycles.

16. The device of claim 12, wherein, to extract the contact voltage noise, the evaluation device is further configured to:

determine a deviation of the detected contact voltage characteristic from a predetermined reference curve.

17. The device of claim 12, wherein the monitoring device is further configured to:

monitor an amplitude of the contact voltage noise during operation of the elementary relay.

18. The device of claim 12, wherein the monitoring device is further configured to:

monitor a noise length of the contact voltage noise across the load contact during operation of the elementary relay.

19. The device of claim 12, wherein the monitoring device is further configured to:

monitor a change over time in the contact voltage noise across the load contact with respect to a number of switching cycles of the elementary relay.

20. The device of claim 12, wherein the controller is further configured to:

output a warning when a predetermines limit value for the averaged noise length is exceeded.

* * * * *